US011698590B2

(12) United States Patent
Song et al.

(10) Patent No.: US 11,698,590 B2
(45) Date of Patent: Jul. 11, 2023

(54) COLLECTOR MIRROR AND APPARATUS FOR CREATING EXTREME ULTRAVIOLET LIGHT INCLUDING THE SAME

(71) Applicant: SAMSUNG ELECTRONICS CO., LTD., Suwon-si (KR)

(72) Inventors: Hoseok Song, Hwaseong-si (KR); Sunghyup Kim, Hwaseong-si (KR); Injae Lee, Hwaseong-si (KR); Jeonggil Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/709,534

(22) Filed: Mar. 31, 2022

(65) Prior Publication Data

US 2023/0071131 A1 Mar. 9, 2023

(30) Foreign Application Priority Data

Sep. 7, 2021 (KR) .................. 10-2021-0118840

(51) Int. Cl.
*G03F 7/20* (2006.01)
*G03F 7/00* (2006.01)
*H05G 2/00* (2006.01)

(52) U.S. Cl.
CPC .......... *G03F 7/70175* (2013.01); *G03F 7/702* (2013.01); *G03F 7/70033* (2013.01);
(Continued)

(58) Field of Classification Search
CPC ........ G03F 7/702; G03F 7/70033; G03F 7/70; G03F 7/70008; G03F 7/7015; G03F 7/70166; G03F 7/70175; G03F 7/70191; G03F 7/708; G03F 7/70808; G03F 7/70816; G03F 7/70825; G03F 7/70833; G03F 7/70841; G03F 7/70858; G03F 7/70883; G03F 7/70891; G03F 7/70908–70941; G03F 7/70975; G03F 7/70991; H05G 2/00–008
(Continued)

(56) References Cited

U.S. PATENT DOCUMENTS 8,901,523 B1 12/2014 Ershov et al.
9,013,679 B2 4/2015 Labetski et al.
(Continued)

FOREIGN PATENT DOCUMENTS

CN 105518530 A 4/2016
JP 4842084 B2 10/2011

OTHER PUBLICATIONS

Extended European Search Report dated Oct. 10, 2022 for corresponding EP 22166490.7.

*Primary Examiner* — Christina A Riddle
(74) *Attorney, Agent, or Firm* — Lee IP Law, P.C.

(57) ABSTRACT

A collector mirror for an extreme ultraviolet (EUV) light generator includes a first mirror in a vessel, the vessel being configured to receive a material and a laser beam for generating the EUV light, a second mirror surrounding the first mirror, and a detachable third mirror between the first mirror and the second mirror, the third mirror having an inner diameter that is not smaller than an outer diameter of the first mirror, and an outer diameter that is not larger than an inner diameter of the second mirror.

20 Claims, 5 Drawing Sheets

(52) U.S. Cl.
CPC ...... *G03F 7/70925* (2013.01); *G03F 7/70975* (2013.01); *H05G 2/008* (2013.01)

(58) Field of Classification Search
USPC ..... 355/30, 52–55, 67–77; 250/492.1, 492.2, 250/492.22, 492.23, 493.1, 503.1, 504 R, 250/505.1; 359/838–884
See application file for complete search history.

(56) References Cited

U.S. PATENT DOCUMENTS

| | | |
|---|---|---|
| 9,377,693 B2 | 6/2016 | Huang et al. |
| 9,541,840 B2 | 1/2017 | Brandt et al. |
| 9,645,503 B2 | 5/2017 | Saenger et al. |
| 10,401,602 B2 | 9/2019 | Kim et al. |
| 10,635,002 B2 | 4/2020 | Brandt et al. |
| 10,990,016 B2 | 4/2021 | Ueda |
| 2004/0257546 A1* | 12/2004 | Banine ................ G03F 7/70175 355/71 |
| 2005/0199829 A1 | 9/2005 | Partlo et al. |
| 2013/0161540 A1* | 6/2013 | Nagai .................... H05G 2/005 250/504 R |
| 2017/0097572 A1* | 4/2017 | Brandt .................. G03F 7/7015 |
| 2020/0004160 A1* | 1/2020 | Chen .................... G03F 7/70033 |
| 2020/0137863 A1* | 4/2020 | Hsu .................... G03F 7/70916 |
| 2022/0334472 A1* | 10/2022 | Tsai ..................... G03F 7/2026 |

* cited by examiner

COLLECTOR MIRROR AND APPARATUS FOR CREATING EXTREME ULTRAVIOLET LIGHT INCLUDING THE SAME

CROSS-REFERENCE TO RELATED APPLICATION

This application claims priority under 35 USC § 119 to Korean Patent Application No. 10-2021-0118840, filed on Sep. 7, 2021, in the Korean Intellectual Property Office (KIPO), the contents of which are herein incorporated by reference in their entirety.

BACKGROUND

1. Field

Example embodiments relate to a collector mirror and an apparatus for creating extreme ultraviolet light including the same. More particularly, example embodiments relate to a collector mirror configured to reflect extreme ultraviolet light and an apparatus for creating extreme ultraviolet light including the collector mirror.

2. Description of the Related Art

Extreme ultraviolet (EUV) light may be created using an EUV light creating apparatus. The EUV light creating apparatus may be classified into a discharge produced plasma (DPP) type apparatus and a laser produced plasma (LPP) type apparatus.

The DPP type apparatus may generate the EUV light from high-density plasma formed by applying high voltage to a material. The LPP type apparatus may generate the EUV light from high-density plasma formed by applying a laser beam to a material. For example, in the LPP type apparatus, the material and the laser may be introduced into a vessel, and the EUV light generated in the vessel may be reflected to an exposure chamber by a collector mirror.

SUMMARY

According to example embodiments, there may be provided a collector mirror for creating EUV light. The collector mirror may include a first mirror, a second mirror and a third mirror. The first mirror may be installed at a vessel configured to receive a material and a laser for creating the EUV light. The second mirror may be configured to surround the first mirror. The third mirror may have an inner diameter of no less than an outer diameter of the first mirror and an outer diameter of no more than an inner diameter of the first mirror. The third mirror may be detachably arranged between the first mirror and the second mirror.

According to example embodiments, there may be provided a collector mirror for creating EUV light. The collector mirror may include a first mirror, a second mirror and a third mirror. The first mirror may be installed at a vessel configured to receive a material and a laser for creating the EUV light. The second mirror may be configured to surround the first mirror. The third mirror may have an inner diameter substantially the same as an outer diameter of the first mirror and an outer diameter substantially the same as an inner diameter of the first mirror. The third mirror may be detachably arranged between the first mirror and the second mirror. A combination structure between the first mirror, the second mirror and the third mirror may have a semi-spherical shape. A first nozzle for injecting an air to a surface of the first mirror may be formed on an upper portion of an inner surface of the first mirror. An upper end of an inner surface of the third mirror may be positioned under an upper end of an outer surface of the first mirror to expose an upper portion of the outer surface of the first mirror. A second nozzle for injecting an air to a surface of the third mirror may be formed on the upper portion of the outer surface of the first mirror. An upper end of an outer surface of the third mirror may be positioned over an upper end of an inner surface of the second mirror to expose an upper portion of the outer surface of the third mirror. A third nozzle for injecting an air to a surface of the second mirror may be formed on the upper portion of the outer surface of the third mirror.

According to example embodiments, there may be provided an apparatus for creating EUV light. The apparatus may include a vessel, a material supplier, a laser irradiator and a collector mirror. The vessel may be configured to receive a material and a laser for creating the EUV light. The material supplier may supply the material into the vessel. The laser irradiator may irradiate the laser to the material to create the EUV light. The collector mirror may be configured to reflect the EUV light. The collector mirror may include a first mirror, a second mirror and a third mirror. The first mirror may be installed at the vessel. The second mirror may be configured to surround the first mirror. The third mirror may have an inner diameter of no less than an outer diameter of the first mirror and an outer diameter of no more than an inner diameter of the first mirror. The third mirror may be detachably arranged between the first mirror and the second mirror.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
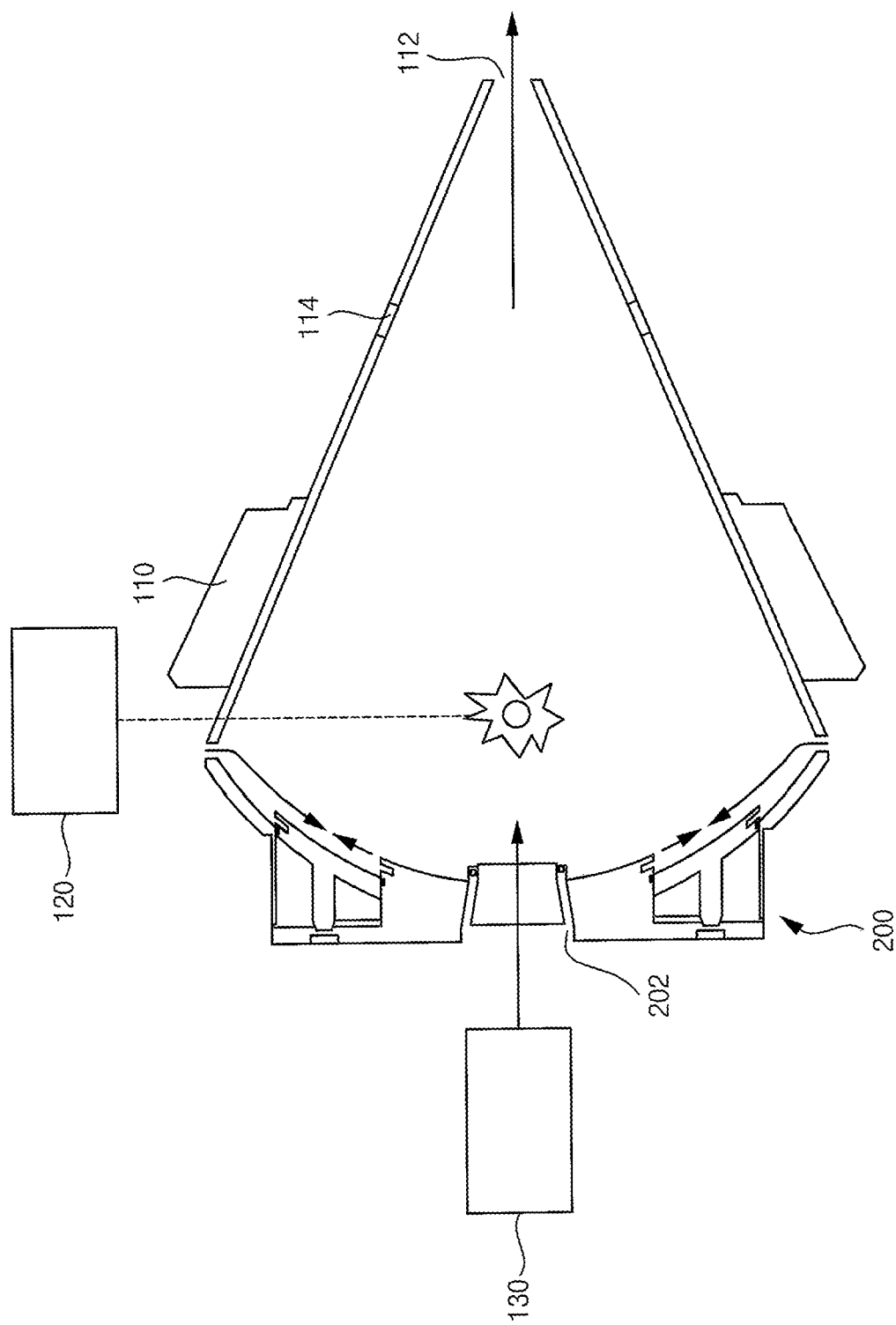
FIG. 1 is a view illustrating an apparatus for creating EUV light in accordance with example embodiments.

FIG. 1 is a view illustrating an apparatus for creating EUV light in accordance with example embodiments.

Referring to FIG. 1, an apparatus for creating EUV light in accordance with example embodiments may include a vessel 110, a material supplier 120, a laser irradiator 130, and a collector mirror 200.

The vessel 110 may have an inner space in which the EUV light may be generated, e.g., created. The EUV light may be created from plasma having a high temperature by irradiating a laser to a material. The vessel 110 may include, e.g., be formed of, a material that may not be damaged by the plasma.

The vessel 110 may have gradually decreased widths from left to right, e.g., the vessel 110 may have an approximate conical cross-section. The vessel 110 may have an opened left surface, e.g., a base of the conical cross-section may include an opening therethrough or be completely open. A focusing aperture 112 may be formed at a right surface of the vessel 110, e.g., the focusing aperture 112 may be at an apex of the conical cross-section to face the base of the conical cross-section. The EUV light may pass through the focusing aperture 112. An exhaust opening 114, through which byproducts (generated during generation of the EUV light) may be discharged, may be formed through a side surface of the vessel 110. The exhaust opening 114 may be connected with a scrubber.

The material supplier 120 may be arranged over the vessel 110. The material supplier 120 may vertically supply the material into the vessel 110, e.g., the material supplier 120 may supply material droplets into the vessel 110 one by one along a direction perpendicular to a line extending from the base to the apex of the conical cross-section. For example, the material may include tin, tin compound, etc.

In order to accurately supply the material droplets to a laser irradiation point in the vessel 110, a position of the material supplier 120 may be controlled by a controller. For example, the controller may minutely move the material supplier 120 in vertical and horizontal directions, e.g., along directions parallel and perpendicular to a line extending from the base to the apex of the conical cross-section.

The laser irradiator 130 may be arranged left of the vessel 110, e.g., the laser irradiator 130 may be outside the vessel 110 and adjacent to the base of the conical cross-section. The laser irradiator 130 may irradiate a laser beam into the vessel 110 through, e.g., a center of, the opened left surface of the vessel 110. Thus, an irradiating direction of the laser irradiated from the laser irradiator 130 may be substantially perpendicular to the supplying direction of the material droplet. In other words, the irradiating direction of the laser may be along a line extending from the base to the apex of the conical cross-section, while the supplying direction of the material droplets may be perpendicular to the irradiation direction. For example, the laser irradiator 130 may include, e.g., emit, a carbon dioxide laser.

In order to accurately irradiate the laser beam along the horizontal direction toward the vertically supplied, e.g., moved, material from the material supplier 120, a position of the laser irradiator 130 may be controlled by the controller. For example, the controller may minutely move the laser irradiator 130 in the vertical and horizontal directions.

The collector mirror 200 may be arranged at the opened left surface of the vessel 110, e.g., the collector mirror 200 may be arranged at the open base of the conical cross-section of the vessel 110. For example, as illustrated in FIG. 1, the collector mirror 200 may be between the laser irradiator 130 and the vessel 110, e.g., the collector mirror 200 may curve out of the vessel 110 toward the laser irradiator 130. The collector mirror 200 may reflect the EUV light generated in the vessel 110 toward the focusing aperture 112. The EUV light passing through the focusing aperture 112 may continue, e.g., be incident on, to an exposure chamber. The collector mirror 200 may include a hole 202, e.g., in a central portion of the collector mirror 200, so the laser beam from the laser irradiator 130 may pass through the hole 202 into the vessel 110.

Figure 2:
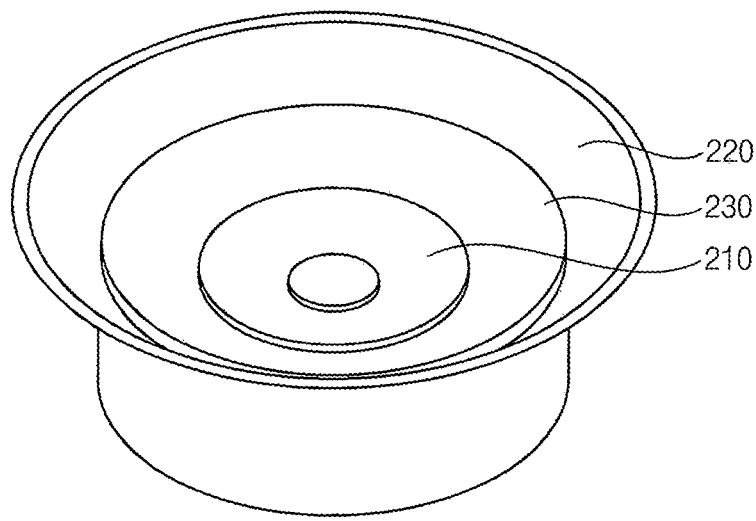
FIG. 2 is an enlarged cross-sectional view illustrating a collector mirror of the apparatus in FIG. 1.
Figure 3:
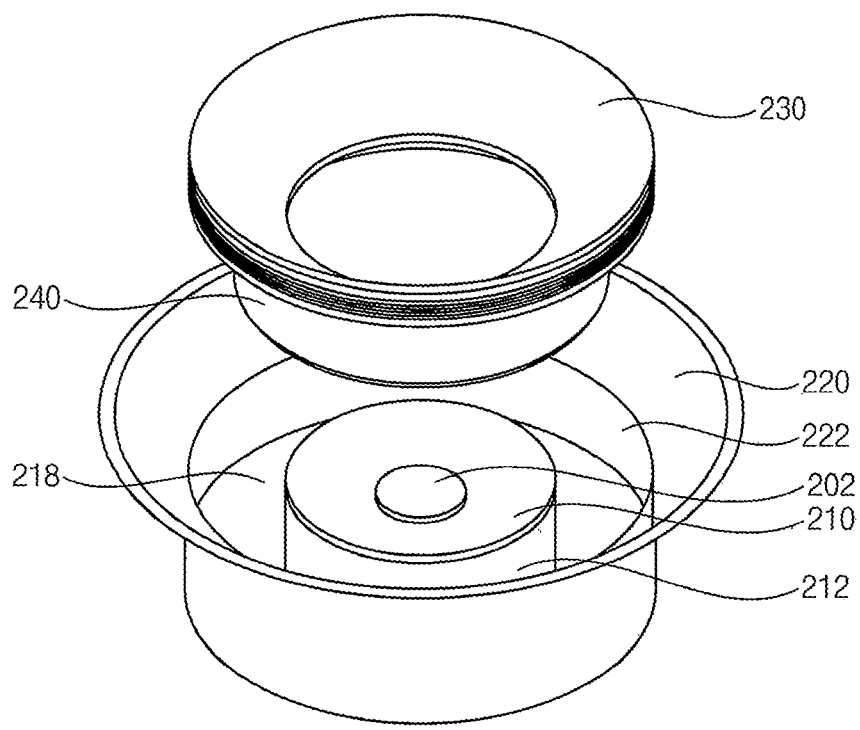
FIG. 3 is a perspective view illustrating a separated third mirror of the collector mirror in FIG. 2.
Figure 4:
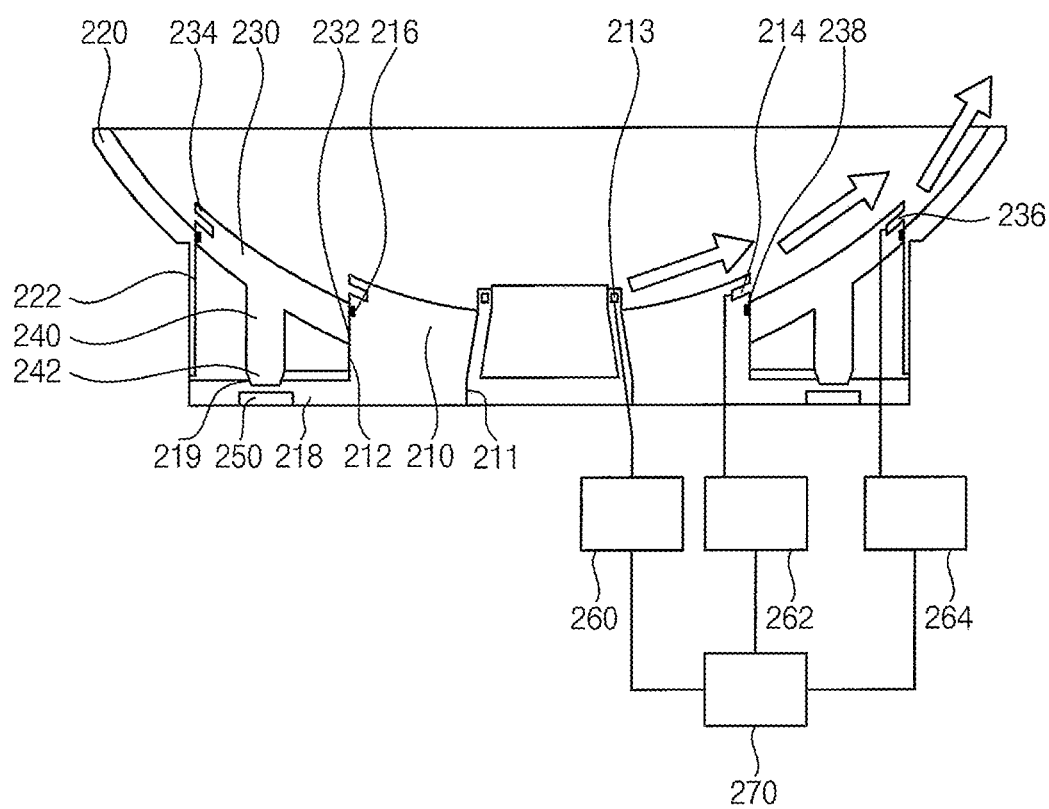
FIG. 4 is a cross-sectional view illustrating the collector mirror in FIG. 2.
Figure 5:
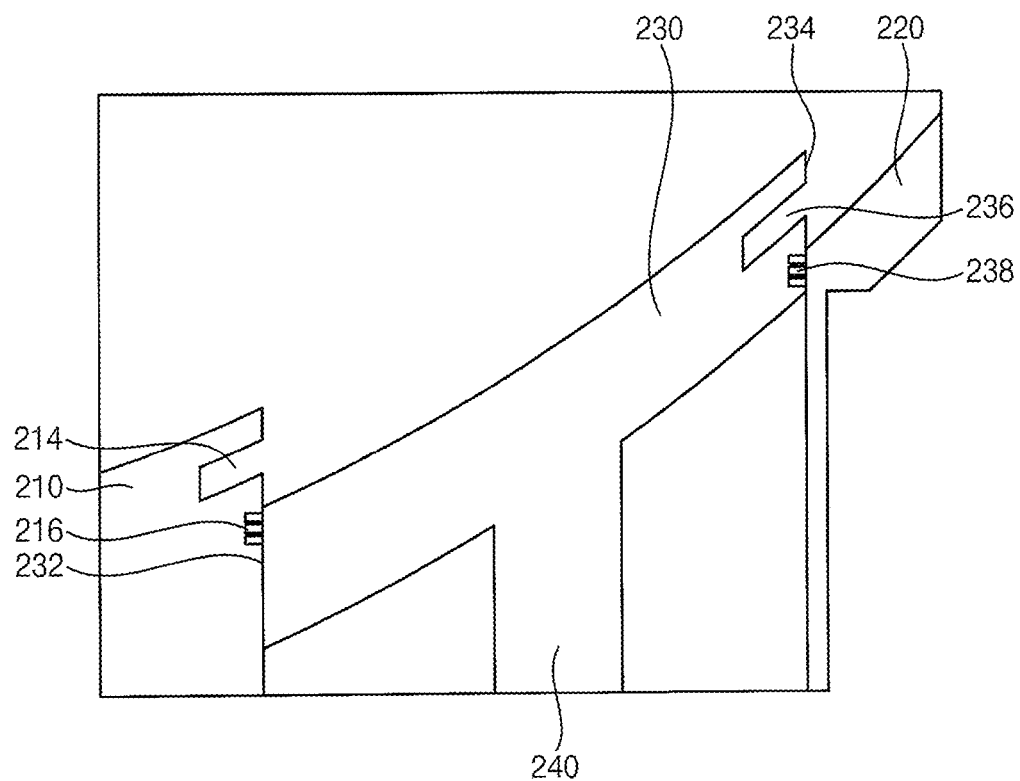
FIG. 5 is an enlarged cross-sectional view illustrating a third mirror of the collector mirror in FIG. 4.
Figure 6:
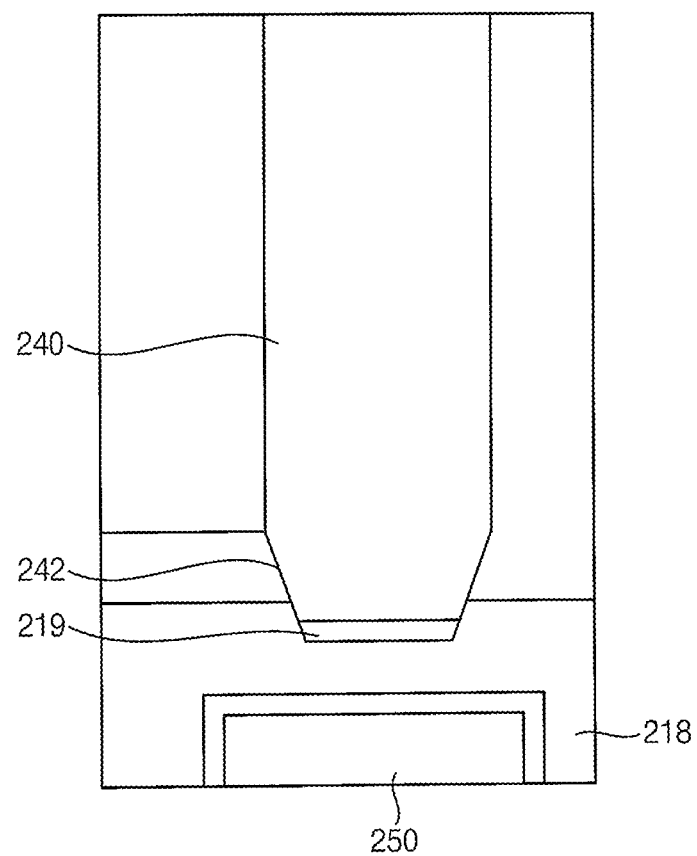
FIG. 6 is an enlarged cross-sectional view illustrating a fixing portion of the collector mirror in FIG. 4.

FIG. 2 is an enlarged cross-sectional view of the collector mirror 200, FIG. 3 is a perspective view of a separated third mirror of the collector mirror 200, FIG. 4 is a cross-sectional view of the collector mirror in FIG. 2, FIG. 5 is an enlarged cross-sectional view illustrating a third mirror of the collector mirror 200, and FIG. 6 is an enlarged cross-sectional view of a fixing portion of the collector mirror 200. FIG. 6 is an enlarged cross-sectional view of a portion of FIG. 4.

Referring to FIGS. 2 to 6, the collector mirror 200 may have a semi-spherical shape. An inner surface of the collector mirror 200, i.e., a surface facing the interior of the vessel 110, may have the semi-spherical shape, and may correspond to a reflecting surface configured to reflect the EUV light toward the focusing aperture 112.

In detail, referring to FIG. 2, the collector mirror 200 may include a first mirror 210, a second mirror 220, and a third mirror 230. The first mirror 210 may have a first diameter. The second mirror 220 may have a second diameter longer than the first diameter. The third mirror 230 may have a third diameter longer than the first diameter and shorter than the second diameter. The first mirror 210, the third mirror 230, and the second mirror 220 may be sequentially stacked, e.g., sequentially from smallest to largest. That is, the third mirror 230 may be stacked on the first mirror 210. The second mirror 220 may be stacked on the third mirror 230, e.g., the third mirror 230 may be between the first mirror 210 and the second mirror 220

When the first mirror 210, the third mirror 230, and the second mirror 220 are sequentially stacked and combined with each other, a combined structure of the first mirror 210, the third mirror 230, and the second mirror 220 may have a semi-spherical shape. For example, referring to FIGS. 1, 2, and 4, each of first mirror 210, the third mirror 230, and the second mirror 220 may have a curved surface that faces the interior of the vessel 110, and the combined structure of the first mirror 210, the third mirror 230, and the second mirror 220 may have the respective curved surfaces that face the interior of the vessel 110 arranged into a semi-spherical shape. As will be explained in detail below, the respective curved surfaces may be arranged into the semi-spherical shape without overlapping each other. For example, as illustrated in FIG. 3, the third mirror 230 may be a middle portion of the semi-spherical shaped structure, and may be separable, e.g., detachable, from the semi-spherical shaped structure.

Referring to FIGS. 1 and 3, the first mirror 210 may be arranged at the central portion of the opened left surface of the vessel 110, e.g., the first mirror 210 may be arranged at the center of the open base of the conical cross-section of the vessel 110. The hole 202 through which the laser beam passes may be formed through a central portion of the first mirror 210. Thus, the first mirror 210 may have an inner surface 211 configured to define an inner diameter of the first mirror 210 (i.e., a dimeter of the hole 202) and an outer surface 212 configured to define an outer diameter of the first mirror 210 (FIG. 4).

As illustrated in FIG. 4, a first nozzle 213 may be formed at an upper end of the inner surface 211 of the first mirror 210. The first nozzle 213 may be formed in a direction substantially parallel to a surface of the first mirror 210. The first nozzle 213 may inject air to the surface of the first mirror 210 to remove the byproducts from the surface of the first mirror 210, e.g., the first nozzle 213 may inject air to the surface of the first mirror 210 that connects the inner and outer surfaces 211 and 212 and faces the interior of the vessel 110. A first air source 260 may be connected to the first nozzle 213. Thus, the air may be supplied from the first air source 260 to the first nozzle 213.

As further illustrated in FIG. 4, the first mirror 210 may include a plate-shaped body portion 218. The body portion 218 may be extended from the outer surface 212 of the first mirror 210 along a radial direction of the first mirror 210. The body portion 218 may be positioned under the third mirror 230. For example, referring to FIGS. 3 and 4, the body portion 218 may extend, e.g., and connect, between the first mirror 210 and the body portion 218.

As illustrated in FIGS. 3 and 4, the second diameter of the second mirror 220 may be longer than the first diameter of the first mirror 210, so the second mirror 220 may be configured to surround, e.g., an entire outer perimeter of, the first mirror 210. Thus, the second mirror 220 may have an inner surface 222 (i.e., a surface facing the first mirror 210) configured to define an inner diameter of the second mirror 220 and an outer surface configured to define an outer diameter of the second mirror 220.

For example, as illustrated in FIG. 3, the second mirror 220 may be integrally formed with the first mirror 210, e.g., the inner surface 222 of the second mirror 220 may be integrally formed with (connected to) the outer surfaces 212 of the first mirror 210 via the body portion 218. In another example, the second mirror 220 may be a separated part detachably connected to the first mirror 210.

As further illustrated in FIGS. 3 and 4, the third mirror 230 may be arranged between the first mirror 210 and the second mirror 220. Byproducts scattered in the vessel 110 may be partially stagnated (e.g., stationary) around the third mirror 230. Thus, the byproducts may mainly contaminate the third mirror 230 rather than the first mirror 210 and the second mirror 220.

The third mirror 230 may have an inner surface 232 configured to define an inner diameter of the third mirror 230 and an outer surface 234 configured to define an outer diameter of the third mirror 230. The inner diameter of the third mirror 230 may be no less than the outer diameter of the first mirror 210, e.g., so the third mirror 230 may not extend radially beyond the outer surface 212 of the first mirror 210. The outer diameter of the third mirror 230 may be no more than the inner diameter of the second mirror 220, e.g., so the third mirror 230 may not extend radially beyond the inner surface 222 of the second mirror 220. Thus, the third mirror 230 may enter, e.g., be inserted, into a space between the first mirror 210 and the second mirror 220, e.g., between the outer surface 212 of the first mirror 210 and the inner surface 222 of the second mirror 220, without interference with the first mirror 210 and the second mirror 220. That is, the third mirror 230 may not overlap, e.g., cover or interfere with, surfaces of the first mirror 210 and the second mirror 220 that face the interior of the vessel 110. Thus, an overlap portion may not exist between the first mirror 210 and the third mirror 230 and between the third mirror 230 and the second mirror 220 along a direction facing the interior of the vessel 110.

For example, as illustrated in FIG. 3, the third mirror 230 may be removable, e.g., portable or detachable, along a direction vertical, e.g., normal, with respect to the body portion 218 extending between the first mirror 210 and the second mirror 220. As, e.g., only, the third mirror 230 may be vertically removed out of the collector mirror 200, a separate cleaning process on only the third mirror 230 may be performed.

In example embodiments, the inner diameter of the third mirror 230 may be substantially the same as the outer diameter of the first mirror 210. Thus, an inner surface 232 of the third mirror 230 may, e.g., directly, contact the outer surface 212 of the first mirror 210. A labyrinth seal 216 may be formed at the outer surface 212 of the first mirror 210 that contacts the inner surface 232 of the third mirror 230.

Referring to FIG. 5, an upper end of the inner surface 232 of the third mirror 230 may be positioned under, e.g., at a lower height level than, an upper end of the outer surface 212 of the first mirror 210. In other words, a surface of the first mirror 210 facing the interior of the vessel 110 may be at a higher level than a surface of the third mirror 230 facing the interior of the vessel 110 relative to a bottom of the body portion 118, so the outer surface 212 of the first mirror 210 may extend beyond, e.g., above, the surface of the third mirror 230 facing the interior of the vessel 110 relative to the bottom of the body portion 118. Therefore, an upper portion of the outer surface 212 of the first mirror 210 may be exposed, not covered, by the inner surface 232 of the third mirror 230.

As further illustrated in FIG. 5, a second nozzle 214 may be formed at the upper portion of the outer surface 212 of the first mirror 210. The second nozzle 214 may be formed in a direction substantially parallel to a surface of the third mirror 230 that faces the interior of the vessel 110. The second nozzle 214 may inject air to the surface of the third mirror 230 to remove byproducts from the surface of the third mirror 230. A second air source 262 may be connected to the second nozzle 214 (FIG. 4). Thus, air may be supplied from the second air source 262 to the second nozzle 214.

In example embodiments, the outer diameter of the third mirror 230 may be substantially the same as the inner diameter of the second mirror 220. Thus, the outer surface 234 of the third mirror 230 may, e.g., directly, contact the inner surface 222 of the second mirror 220. A labyrinth seal 238 may be formed at the outer surface 234 of the third mirror 230 that contacts the inner surface 222 of the second mirror 220.

Referring to FIG. 5, an upper end of the outer surface 234 of the third mirror 230 may be positioned over, e.g., at a higher height level than, an upper end of the inner surface 222 of the second mirror 220. In other words, a surface of the third mirror 230 facing the interior of the vessel 110 may be at a higher level than a surface of the second mirror 220 facing the interior of the vessel 110 relative to the bottom of the body portion 118, so the outer surface 234 of the third mirror 2310 may extend beyond, e.g., above, the surface of the second mirror 220 facing the interior of the vessel 110 relative to the bottom of the body portion 118. Thus, an upper portion of the outer surface 234 of the third mirror 230 may be exposed, not covered, by the inner surface 222 of the second mirror 220.

A third nozzle 236 may be formed at the upper portion of the outer surface 234 of the third mirror 230. The third nozzle 236 may be formed in a direction substantially parallel to the surface of the second mirror 220 facing the interior of the vessel 110. The third nozzle 236 may inject air to the surface of the second mirror 220 to remove byproducts from the surface of the second mirror 220. A third air source 264 may be connected to the third nozzle 236 (FIG. 4). Thus, air may be supplied from the third air source 264 to the third nozzle 236.

A controller 270 may individually control the first air source 260, the second air source 262, and the third air source 264 (FIG. 4). In detail, the controller 270 may individually control a pneumatic pressure in the first air source 260, a pneumatic pressure in the second air source 262, and a pneumatic pressure in the third air source 264. As mentioned above, because the contamination level of the third mirror 230 may be relatively higher than the contamination levels of the first and second mirrors 210 and 220, the pneumatic pressure of the air injected from the second nozzle 214 to clean the third mirror 230 may be higher than the pneumatic pressures of the air injected from the first nozzle 213 and the third nozzle 236 to improve cleaning efficiency. Thus, the controller 270 may provide the second air source 262 with a pneumatic pressure higher than the pneumatic pressures in the first and third air sources 260 and 264.

In order to affix the third mirror 230 to the body portion 218 between the first mirror 210 and the second mirror 220, the third mirror 230 may include a fixing portion 240. The fixing portion 240 may be extended from the lower surface of the third mirror 230 toward the body portion 218. For example, the fixing portion 240 may include one portion arranged in a circumferential line of the third mirror 230, e.g., the fixing portion 240 may extend continuously to surround an entire perimeter of the first mirror 210. In another example, the fixing portion 240 may include a plurality of portions arranged in a plurality of the circumferential lines of the third mirror 230, e.g., the fixing portion 240 may include a plurality of discrete portions circumferentially spaced apart from each other to surround the first mirror 210.

In detail, as illustrated in FIG. 6, the fixing portion 240 may include a downwardly tapered lower end 242. A fixing groove 219 may be formed in the body portion 218, so the tapered lower end 242 of the fixing portion 240 may be inserted into the fixing groove 219 in the body portion 218. The fixing groove 219 may have a tapered shape corresponding to the tapered lower end 242.

Further, a magnet 250 may be arranged in the body portion 218. The magnet 250 may be configured to fix the fixing portion 240 using a magnetic force. In order to apply the magnetic force from the magnet 250 to the fixing portion 240, the fixing portion 240 may include a magnetic material. For example, the magnet 250 may include an electromagnet.

According to example embodiments, the collector mirror 200 may include the three mirrors, as described above. In other examples, the collector mirror 200 may include two mirrors or at least four mirrors.

By way of summation and review, byproducts generated during generation of EUV light may be accumulated in the EUV light generator, e.g., stacked on a surface of a collector mirror, thereby contaminating the collector mirror. For example, the byproducts may be concentratedly in a middle portion of the collector mirror, so the contamination level of the middle portion of the collector mirror may be relatively higher than contamination levels of other portions of the collector mirror. While the entire collector mirror may be separated from the apparatus to be cleaned, it may be complicated and reduces the overall available operating time of the apparatus.

In contrast, example embodiments provide a collector mirror in which a partial cleaning may be performed, as well as an apparatus for generating EUV light including the collector mirror. That is, according to example embodiments, a collector mirror may include a third mirror (which may be mainly contaminated during EUV light generation) that is detachably arranged between a first mirror and a second mirror, so that a cleaning process may be performed only on the third mirror. Thus, it may not be required to separate the whole collector mirror from the vessel so that an overall available operating time of the EUV light generator may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A collector mirror for an extreme ultraviolet (EUV) light generator, the collector mirror comprising:
    a first mirror in a vessel, the vessel being configured to receive a material and a laser beam for generating the EUV light;
    a second mirror surrounding the first mirror; and
    a detachable third mirror between the first mirror and the second mirror, the third mirror having an inner diameter that is substantially the same as an outer diameter of the first mirror, and an outer diameter that is substantially the same as an inner diameter of the second mirror.

2. The collector mirror as claimed in claim 1, wherein a combined structure of the first mirror, the second mirror, and the third mirror has a semi-spherical shape.

3. The collector mirror as claimed in claim 2, wherein an inner surface of the third mirror is in direct contact with an outer surface of the first mirror.

4. The collector mirror as claimed in claim 3, wherein the outer surface of the first mirror and the inner surface of the third mirror have a labyrinth seal therebetween.

5. The collector mirror as claimed in claim 2, wherein an outer surface of the third mirror is in direct contact with an inner surface of the second mirror.

6. The collector mirror as claimed in claim 5, wherein the outer surface of the third mirror and the inner surface of the second mirror have a labyrinth seal therebetween.

7. The collector mirror as claimed in claim 1, wherein the first mirror includes:
    a first surface facing an interior of the vessel; and
    an inner surface connected to the first surface, an upper portion of the inner surface including a first nozzle directed toward the first surface to inject air.

8. The collector mirror as claimed in claim 7, further comprising:
    a first air source connected to the first nozzle, the first air source being configured to supply air to the first nozzle; and
    a controller configured to control a pressure of the air supplied from the first air source to the first nozzle.

9. The collector mirror as claimed in claim 1, wherein:
    an upper end of an inner surface of the third mirror is at a lower height level than an upper end of an outer surface of the first mirror, such that an upper portion of the outer surface of the first mirror is exposed, and
    a second nozzle is at the exposed upper portion of the outer surface of the first mirror, the second nozzle being directed toward a surface of the third mirror.

10. The collector mirror as claimed in claim 9, further comprising:
    a second air source connected to the second nozzle, the second air source being configured to supply air to the second nozzle; and
    a controller configured to control a pressure of the air supplied from the second air source to the second nozzle.

11. The collector mirror as claimed in claim 1, wherein:
    an upper end of an outer surface of the third mirror is at a higher height level than an upper end of an inner surface of the second mirror, such that an upper portion of the outer surface of the third mirror is exposed, and a third nozzle is at the exposed upper portion of the outer surface of the third mirror, the third nozzle being directed toward a surface of the second mirror.

12. The collector mirror as claimed in claim 11, further comprising:

a third air source connected to the third nozzle, the third air source being configured to supply air to the third nozzle; and a controller configured to control a pressure of the air supplied from the third air source to the third nozzle.

13. The collector mirror as claimed in claim 1, wherein the first mirror includes a fixing groove, and the third mirror includes a fixing portion extended from a lower surface of the third mirror into the fixing groove.

14. The collector mirror as claimed in claim 13, wherein the fixing portion has a downwardly tapered lower end, and the fixing groove has a tapered shape corresponding to the tapered lower end of the fixing portion.

15. The collector mirror as claimed in claim 14, further comprising a magnet in the first mirror to fix the fixing portion using a magnetic force.

16. A collector mirror for an extreme ultraviolet (EUV) light generator, the collector mirror comprising:

a first mirror in a vessel, the vessel being configured to receive a material and a laser beam to generate the EUV light;

a second mirror surrounding the first mirror; and a detachable third mirror between the first mirror and the second mirror, the third mirror having an inner diameter that is substantially the same as an outer diameter of the first mirror, and an outer diameter that is substantially the same as an inner diameter of the second mirror, wherein a combined structure of the first mirror, the second mirror, and the third mirror has a semi-spherical shape, wherein the first mirror includes a first nozzle at an upper portion of an inner surface of the first mirror, the first nozzle being directed toward the first mirror, wherein an upper end of an inner surface of the third mirror is at a lower height level than an upper end of an outer surface of the first mirror, such that an upper portion of the outer surface of the first mirror is exposed, and a second nozzle is positioned at the exposed upper portion of the outer surface of the first mirror to inject air toward the third mirror, and wherein an upper end of an outer surface of the third mirror is at a higher height level than an upper end of an inner surface of the second mirror, such that an upper portion of the outer surface of the third mirror is exposed, and a third nozzle is positioned at the exposed upper portion of the outer surface of the third mirror to inject air toward the second mirror.

17. The collector mirror as claimed in claim 16, further comprising:

a first air source connected to the first nozzle and configured to supply air to the first nozzle;

a second air source connected to the second nozzle and configured to supply air to the second nozzle;

a third air source connected to the third nozzle and configured to supply air to the third nozzle; and a controller configured to individually control pressures from the first to third air sources to the first to third nozzles, respectively.

18. The collector mirror as claimed in claim 16, wherein the third mirror includes a fixing portion extended from a lower surface of the third mirror, and the first mirror includes a fixing groove configured to receive the fixing portion.

19. The collector mirror as claimed in claim 18, wherein the fixing portion has a lower end having a downwardly tapered shape, and the fixing groove has a tapered shape corresponding to the lower end of the fixing portion.

20. An apparatus for generating extreme ultraviolet (EUV) light, the apparatus comprising:

a vessel configured to receive a material and a laser beam to generate the EUV light;

a material supplier configured to supply the material into the vessel;

a laser irradiator configured to irradiate the laser beam toward the material in the vessel; and a collector mirror configured to reflect the EUV, the collector mirror including:

a first mirror in the vessel, a second mirror surrounding the first mirror, and a detachable third mirror between the first mirror and the second mirror, the third mirror having an inner diameter that is substantially the same as an outer diameter of the first mirror, and an outer diameter that is substantially the same as an inner diameter of the second mirror.

* * * * *